United States Patent
Kanno et al.

(10) Patent No.: US 7,501,659 B2
(45) Date of Patent: Mar. 10, 2009

(54) LED DEVICE AND OPTICAL DETECTOR THEREWITH FOR BILL VALIDATOR

(75) Inventors: Noriyuki Kanno, Sagamihara (JP); Masahiro Motohara, Sagamihara (JP); Takeshi Mitsuma, Sagamihara (JP)

(73) Assignee: Japan Cash Machine Co., Ltd. (JP)

(*) Notice: Subject to any disclaimer, the term of this patent is extended or adjusted under 35 U.S.C. 154(b) by 262 days.

(21) Appl. No.: 11/404,262

(22) Filed: Apr. 11, 2006

(65) Prior Publication Data

US 2006/0231856 A1     Oct. 19, 2006

(30) Foreign Application Priority Data

Apr. 12, 2005   (JP)   ............... 2005-114891

(51) Int. Cl.
  *H01L 27/15*   (2006.01)
  *H01L 31/12*   (2006.01)
  *H01L 33/00*   (2006.01)
(52) U.S. Cl. ............... 257/80; 257/80; 257/82
(58) Field of Classification Search ............... 257/80, 257/81, 82, 84
  See application file for complete search history.

(56) References Cited

U.S. PATENT DOCUMENTS

| | | | |
|---|---|---|---|
| 5,383,546 A | 1/1995 | Mulder | |
| 5,806,649 A | 9/1998 | Walsh et al. | |
| 5,988,345 A | 11/1999 | Bergeron et al. | |
| 7,153,000 B2* | 12/2006 | Park et al. | 362/268 |
| 2002/0080501 A1* | 6/2002 | Kawae et al. | 359/799 |
| 2002/0158257 A1* | 10/2002 | Nei | 257/79 |
| 2004/0188697 A1 | 9/2004 | Brunner | |
| 2006/0198032 A1* | 9/2006 | Saxena et al. | 359/721 |

FOREIGN PATENT DOCUMENTS

| | | |
|---|---|---|
| JP | 63-5656 | 1/1988 |
| JP | 7-202271 | 8/1995 |
| JP | 8-162673 | 6/1996 |
| JP | 8-202293 | 8/1996 |
| JP | 2002-164583 | 6/2002 |
| JP | 2002-368280 | 12/2002 |
| JP | 2003-179271 | 6/2003 |
| JP | 2003-204083 | 7/2003 |
| JP | 2005-45199 | 2/2005 |

* cited by examiner

*Primary Examiner*—Phuc T Dang
(74) *Attorney, Agent, or Firm*—Bachman & LaPointe, P.C.

(57) ABSTRACT

An LED device is provided which comprises a plastic encapsulant 7 formed with an integrated cylindrical lens 8 disposed opposite to an LED chip 5 to provide light from LED chip 5 with the wider directivity angular range in the vertical Y irradiative direction than that in the horizontal X irradiative direction. When light from LED chip 5 is irradiated through cylindrical lens 8 out of plastic encapsulant 7, an outer surface of cylindrical lens 8 serves to transform light from LED chip 5 into a substantially parallel light beam which has a generally linear beam section wider in the directivity angular range of the necessary vertical Y irradiative direction, and narrower in the directivity angular range of the unnecessary horizontal X irradiative direction.

9 Claims, 4 Drawing Sheets

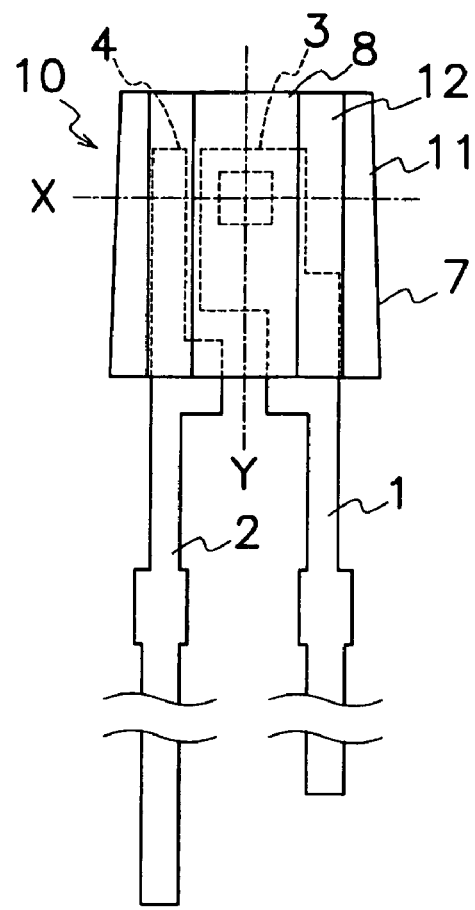
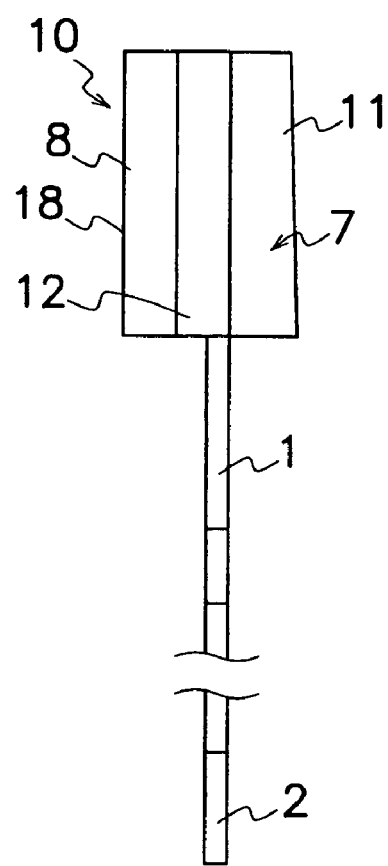
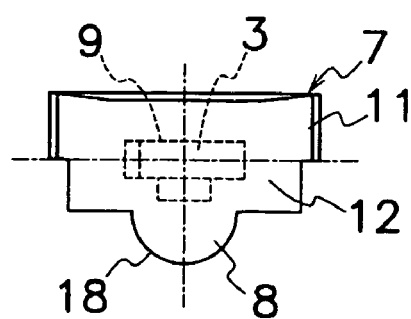

LED DEVICE AND OPTICAL DETECTOR THEREWITH FOR BILL VALIDATOR

TECHNICAL FIELD

This invention relates to an LED device having the wider angular range of light directivity in a required irradiative direction, and an optical detector with the LED device for a bill validator.

BACKGROUND OF THE INVENTION

For example, U.S. Pat. No. 5,383,546 to Argen J. Mulder discloses a device for detecting a foreign body or string in a coin channel when the string connected to a coin is drawn to string or illegally take out the coin from coin channel. The device comprises an infrared emitter, and an infrared sensor for detecting infrared ray emitted from the emitter and reflected on the string.

U.S. Pat. No. 5,806,649 to Michael Walsh, et al., demonstrates a paper currency validator which comprises an LED and light receiver mounted at opposite sides of a wiring board for a bill checker across a bill passageway in the validator to detect a foreign object in the passageway in terms of amount in light emitted from the LED and sensed by the light receiver.

U.S. Pat. No. 5,988,345 to Alfred F. Gergeron, et al., represents a bill validator which comprises an LED and a phototransistor located opposite to and in spaced relation to each other beneath a bill passageway in the validator, a first prism for laterally reflecting light from the diode into the passageway, a second prism for again reflecting light from the first prism toward the photo-transistor across the passageway to detect a foreign matter in the passageway in view of output from the photo-transistor.

In this way, typical prior art optical device for detecting extraneous object, employs a plastic-encapsulated LED device for irradiating light interior of bill passageway. A plastic encapsulant of typical LED device is conventionally formed into a cannonball or shell shape with a hemispherical top end to provide an optical hemispherical lens for converging to some extent light emitted from the diode device toward a light detector. However, such an LED of shell shape is disadvantageous in that it radially illuminate or radiates light diverging toward an irradiance circle section which would incur loss of light dispersed in an irrelevant irradiative direction to light detector. Upon detecting an object in bill passageway by means of light emitted from LED device, such dispersed light radiation may unfavorably deteriorate accurate detection of the object because scattering of light reduces amount of light reaching the detector which therefore cannot appreciate the difference in amount of received light between a bright condition without object and a shadow condition with object in bill passageway.

An object of the present invention is to provide an LED device having the wider light directivity angular range in a necessary irradiative direction. Another object of the present invention is to provide an LED device having a cylindrical lens which can converge light from an LED chip to a linear beam section widened in a first irradiative direction and narrowed in a second irradiative direction different from the first irradiative direction. A still another object of the present invention is to provide an optical detector incorporating the LED device for a bill validator.

SUMMARY OF THE INVENTION

The LED device according to the present invention comprises: a first lead terminal (1) which has a support (3); a second lead terminal (2) which has a joint area (4); an LED chip (5) mounted on support (3) and electrically connected to support (3) and joint area (4); and a light-conductive plastic encapsulant (7) for sealing support (3), LED chip (5) and joint area (4). Plastic encapsulant (7) comprises an integrated cylindrical lens (8) disposed opposite to LED chip (5) to irradiate light emitted from LED chip (5) out of plastic encapsulant (7) with the wider directivity angular range in a first (Y) irradiative direction than that a second (X) irradiative direction. When light from LED chip (5) is irradiated through cylindrical lens (8) out of plastic encapsulant (7), an outer surface of cylindrical lens (8) serves to transform light from LED chip (5) into a substantially parallel light beam. Even though LED chip (5) produces light laterally deviated from just a front area of LED chip (5), outer surface of cylindrical lens (8) also serves to convert such light into substantially parallel light beam without deviating light along the first (Y) irradiative direction of cylindrical lens (8) to cause light beam emitted through cylindrical lens (8) to have a generally linear beam section wider in the directivity angular range of the necessary first (Y) irradiative direction, and narrower in the directivity angular range of the unnecessary second (X) irradiative direction for improvement in the detection accuracy of an object to which light is directed.

The optical detector (15) according to the present invention is used in a bill validator for detecting a foreign matter or a bill in a passageway (20) formed in bill validator for transporting a bill through passageway (20). The optical detector (15) comprises a wiring board (21), LED device (10) mounted on wiring board (21) and disposed on one side of passageway (20), a light reflector (22) disposed on the other side of passageway (20) for receiving and reflecting light from LED device (10) and passing through passageway (20), and a light detector (23) mounted on wiring board (21) for receiving light reflected on light reflector (22) to produce an electric signal of the level corresponding to the amount of received light. LED device (10) has the improved accuracy for detecting an object and therefore can serve to surely discern existence of bill or foreign object in bill passageway (20).

BRIEF DESCRIPTION OF THE DRAWINGS

The above-mentioned and other objects and advantages of the present invention will be apparent from the following description in connection with preferred embodiments shown in the accompanying drawings wherein:

FIG. 5 is a front view of a second embodiment of the LED device according to the present invention;

FIG. 6 is a side elevation view of the second embodiment;

FIG. 7 is a plan view of the second embodiment;

BEST MODE FOR CARRYING OUT THE INVENTION

Figure 1:
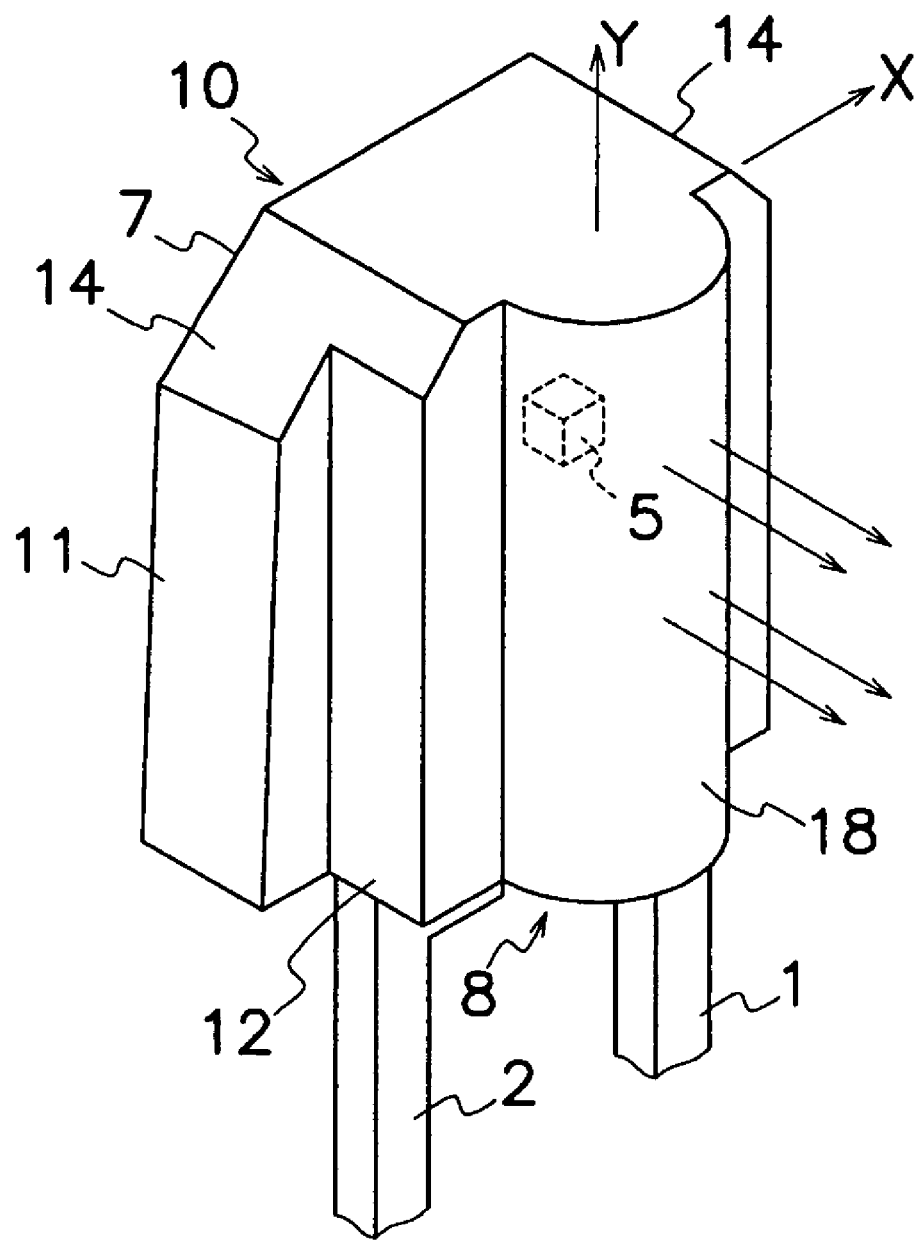
FIG. 1 is a perspective view of a first embodiment of the LED device according to the present invention.
Figure 2:
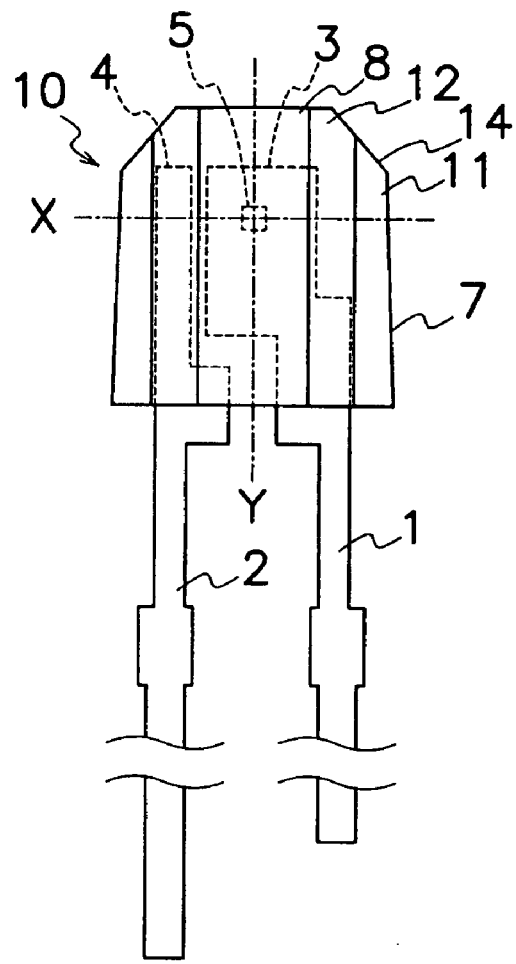
FIG. 2 is a front view of the first embodiment.
Figure 3:
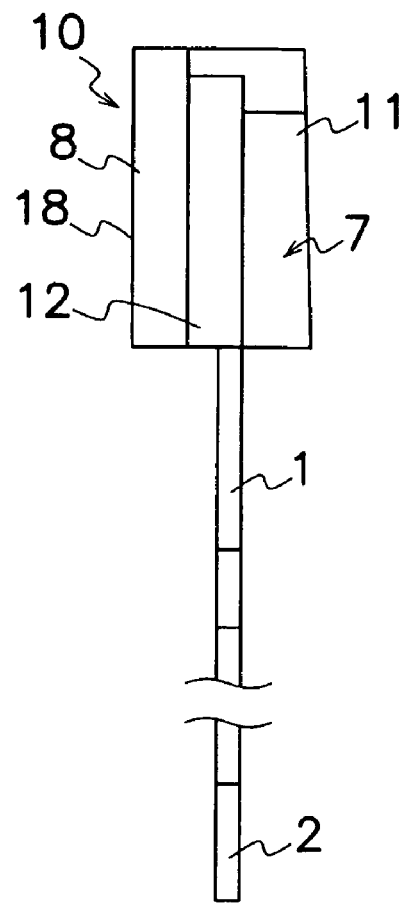
FIG. 3 is a side elevation view of the first embodiment.
Figure 4:
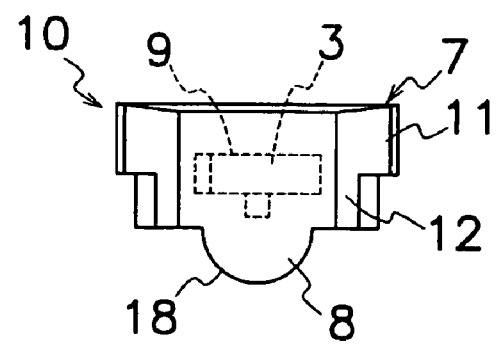
FIG. 4 is a plan view of the first embodiment.

Two embodiments of the LED device and optical detector therewith for bill validator according to the present invention will be described hereinafter in connection with FIGS. 1 to 10 of the drawings.

As shown in FIGS. 1 to 4, the light emitting diode or LED device 10 according to the present invention comprises: a light-conductive plastic encapsulant 7, and first and second lead terminals 1 and 2 extending from plastic encapsulant 7. First lead terminal 1 has a plate pad or support 3 integrated at the top of first lead terminal 1 as shown by dotted lines in FIGS. 2 and 4, and second lead terminal 2 has a joint area 4 integrated at the top of second lead terminal 2. Mounted on support 3 is an LED chip 5 which has two electrodes not shown electrically connected via solder or a lead wire to support 3 and joint area 4. LED chip 5 produces an infrared ray of wavelength in a range from 780 nm to 1300 nm, including near infrared, infrared and far infrared lights. However, LED chip 5 may include at least one selected from the group of LED chips emitting ultra violet, blue color, yellow color, green color, red color, near infrared, infrared and far infrared lights or combined one thereof. Plastic encapsulant 7 comprises a base 11 for sealing from a back surface 9 of support plate 3 to a middle in thickness of support 3 of first lead terminal 1; an intermediate 12 integrated with base 11 to seal LED chip 5; and a cylindrical lens 8 integrated with intermediate 12 in front of or opposite to LED chip 5. Base 11, intermediate 12 and cylindrical lens 8 are integrally formed of transparent, translucent or light-conductive resin selected from the group of epoxy, polyimide, acrylic and polycarbonate resin into plastic encapsulant 7 which seals support 3, LED chip 5 and joint area 4 to prevent invasion of foreign material such as moisture or ions into LED chip 5.

Shown cylindrical lens 8 has a cylindrical surface 18 protruding from intermediate 12 to transform or converge light from LED chip 5 into substantially parallel light of a generally linear beam section. Shown embodiment indicates cylindrical lens 8 of arcuate or partially circular section, but cross section of cylindrical lens 8 may be formed by at least part of curve or curves selected from the group of a circle, ellipse and hyperbola or approximation thereof or combination thereof without limitation to the shown shape. Support 3 is arranged flush with first and second lead terminals 1 and 2 extending from plastic encapsulant 7, and the first, namely longitudinal or vertical Y direction of cylindrical lens 8 is substantially parallel to first and second lead terminals 1 and 2. Cylindrical lens 8 extends from a top to a bottom end of plastic encapsulant 7 along the longitudinal center of intermediate 12. The embodiment shown in FIGS. 1 to 4 has a pair of chamfers 14 formed at top edges of plastic encapsulant 7, but another embodiment shown in FIGS. 5 to 7 does not. LED chip 5 is mounted on support 3 at or near a central or focal point or line of cylindrical lens 8 to irradiate light from LED chip 5 in a parallel beam from outer surface of cylindrical lens 8.

Figure 8:
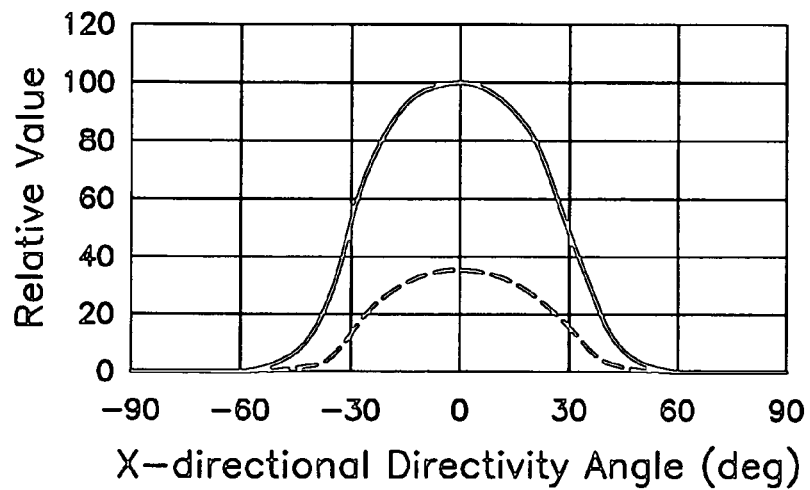
FIG. 8 is a graph indicating an angular range of light directivity in the X irradiative direction from the LED device according to the present invention.
Figure 9:
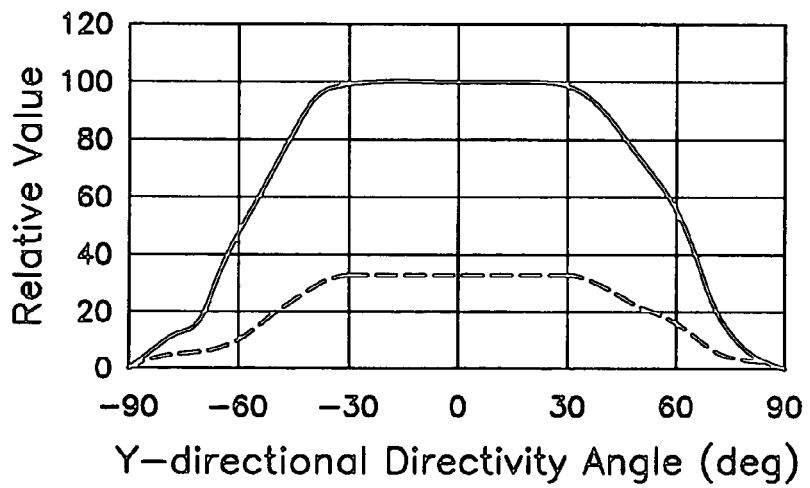
FIG. 9 is a graph indicating an angular range of light directivity in the Y irradiative direction from the LED device according to the present invention.

FIGS. 8 and 9 show graphs indicating angular ranges of light directivity respectively in the second, namely lateral or horizontal X and vertical Y irradiative directions from LED device 10 when electric current flows therethrough. In FIGS. 8 and 9, solid lines denote directivity angles by infrared ray of light wavelength 870 nm, and dotted lines denote directivity angles by infrared ray of light wavelength 940 nm. As apparent from these figures, while the X irradiative direction shows an effective directivity angular range of only ±5 degrees for covering Relative Value 100 level, the Y irradiative direction reaches an effective directivity angular range of ±30 degrees. Infrared ray of 870 nm is shorter in wavelength but greater in emission energy than that of 940 nm, and both indicate the same effect in wider Y- and narrower X-directional directivity angular ranges. In this way, cylindrical lens 8 serves to provide directivity angles in the horizontal and vertical irradiative directions so as to widen the necessary vertical directivity angular range, and narrow the unnecessary horizontal directivity angular range. When light from LED chip 5 is irradiated through cylindrical lens 8 out of plastic encapsulant 7, cylindrical lens 8 can function to converge light laterally deviated from just a front area of LED chip 5 without deviating light along the vertical direction of cylindrical lens 8 to cause light beam emitted through cylindrical lens 8 to have a generally linear beam section. Thus, cylindrical lens 8 expands light directivity angular range in necessary irradiative direction, and reduces light directivity angular range in unnecessary irradiative direction for improvement in the detection accuracy of an object to which light is directed.

Figure 10:
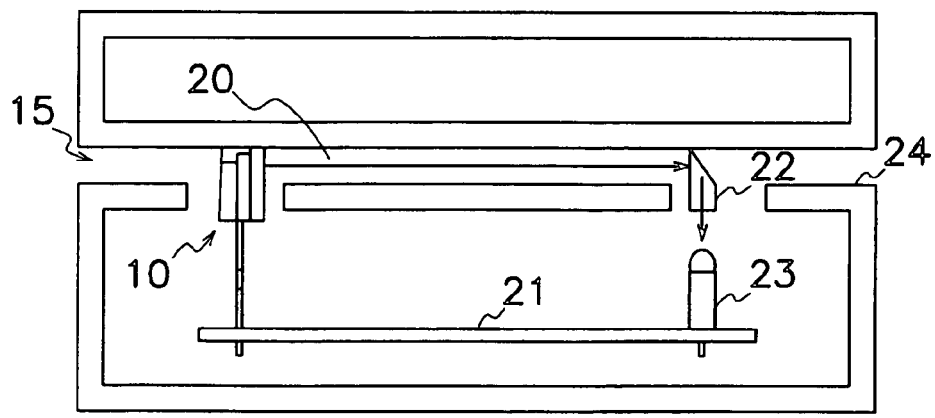
FIG. 10 is a partial sectional view of a bill validator provided with the optical detector according to the present invention.

FIG. 10 illustrates a partially sectional view of a bill validator provided with optical detector 15 to provide an LED device 10. Optical detector 15 comprises a wiring board 21 disposed in a frame 24; LED device 10 mounted on wiring board 21 and disposed on one side of passageway 20; a light reflector 22 disposed on the other side of passageway 20 for receiving and reflecting light from LED device 10 and passing through passageway 20, and a light detector 23 mounted on wiring board 21 for receiving light reflected on light reflector 22 to produce an electric signal of the level corresponding to the amount of received light. In passageway 20, transported bill and foreign matter such as string attached to a bill extend in passageway 20 perpendicularly to the drawing paper surface of FIG. 10. For example, if light emitted from LED device 10 is shut by a string connected to bill which has passed optical detector 15, light detector 23 discerns reduced amount of light as string shades light detector 23. In this case, as cylindrical lens 8 narrows the light directivity range in the horizontal irradiative direction or moved direction of bill in passageway 20, but on the contrary widen the light directivity range in the vertical irradiative direction, light detector 23 can exactly sense or detect existence of bill or string wherever in passageway 20 it is, namely whether it is in a middle position, deviated near or in close contact to bottom or top wall of passageway 20 for improvement in the optical detection accuracy of an object.

The LED device according to the present invention utilizes a cylindrical lens for effectively focusing light toward a light detector, reducing light radiation loss by light deviation from a course toward generally linear beam section for improved accuracy in optically detecting an object and expanded application of the LED device. Also, the LED device is applicable to a bill validator for its exact operation and prevention of illegal action to a bill validator. The present invention is applicable to any field for optically detecting an object by means of light emitted from an LED device.

What is claimed is:

1. An optical detector for use in a bill validator for detecting a foreign object or a bill in a passageway formed in said bill validator to transport the bill through said passageway,
    said optical detector comprising a wiring board, an LED device mounted on said wiring board and disposed on one side of said passageway, a light reflector disposed on the other side of said passageway for receiving and reflecting light from said LED device and passing through said passageway, and a light detector mounted on said wiring board for receiving light reflected on said light reflector to produce an electric signal of the level corresponding to the amount of received light, said LED device comprising:

a first lead terminal which has a support;

a second lead terminal which has a joint area;

an LED chip mounted on said support and electrically connected to said support and joint area; and a light-conductive plastic encapsulant for sealing said support, LED chip and joint area;

said plastic encapsulant comprising an integrated cylindrical lens disposed opposite to said LED chip to irradiate light emitted from said LED chip out of said plastic encapsulant with a wider directivity angular range in a first irradiative direction than that in a second irradiative direction.

2. The optical detector for the bill validator of claim 1, wherein said LED chip is at least one chip selected from the group of LED chips emitting ultra violet, blue color, yellow color, green color, red color, near infrared, infrared and far infrared lights and combinations thereof.

3. The optical detector for the bill validator of claim 1, wherein said plastic encapsulant comprises a base for sealing from a back surface to a middle in thickness of said support of said first lead terminal; an intermediate integrated with said base to seal said LED chip; and said cylindrical lens integrated with said intermediate in front of said LED chip.

4. The optical detector for the bill validator of claim 1, wherein light wavelength from said LED chip is in a range from 780 nm to 1300 nm.

5. The optical detector for the bill validator of claim 1, wherein said support is arranged flush with said first and second lead terminals, said first irradiative direction of the cylindrical lens is substantially parallel to said first and second lead terminals.

6. The optical detector for the bill validator of claim 1, wherein a cross section of the cylindrical lens is formed by at least part of curve or curves selected from the group of a circle, ellipse and hyperbola or approximation thereof or combination thereof.

7. The optical detector for the bill validator of claim 1, wherein said cylindrical lens extends from a top to a bottom end of said plastic encapsulant along the longitudinal center.

8. The optical detector for the bill validator of claim 1, wherein said first irradiative direction is vertical, and said second irradiative direction is horizontal.

9. The optical detector for the bill validator of claim 1, wherein said cylindrical lens is located perpendicularly to a moving direction of the bill along the passageway.

* * * * *